US010976082B2

(12) United States Patent
Lakshmanan et al.

(10) Patent No.: US 10,976,082 B2
(45) Date of Patent: Apr. 13, 2021

(54) THERMOELECTRIC THREAD FOR A HEATING AND/OR COOLING DEVICE

(71) Applicant: The Regents of the University of Michigan, Ann Arbor, MI (US)

(72) Inventors: Sridhar Lakshmanan, Belleville, MI (US); Sean Ahlquist, Ann Arbor, MI (US); Michael Putty, Grosse Pointe Woods, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 97 days.

(21) Appl. No.: 16/295,742

(22) Filed: Mar. 7, 2019

(65) Prior Publication Data
US 2019/0277544 A1    Sep. 12, 2019

Related U.S. Application Data

(60) Provisional application No. 62/639,755, filed on Mar. 7, 2018.

(51) Int. Cl.
*F25B 21/04*        (2006.01)
*H01L 35/32*        (2006.01)
(Continued)

(52) U.S. Cl.
CPC ............ *F25B 21/04* (2013.01); *B60N 2/5685* (2013.01); *B60N 2/5692* (2013.01); *D02G 3/045* (2013.01);
(Continued)

(58) Field of Classification Search
CPC .......... F25B 21/04; H01L 35/32; H01L 35/08; H01L 35/16; H01L 35/18; H01L 35/22;
(Continued)

(56) References Cited

U.S. PATENT DOCUMENTS 4,588,520 A * 5/1986 Jayadev ............... H01L 35/34
                                                    252/512
5,188,286 A * 2/1993 Pence, IV ........ G05D 23/27535
                                                    236/1 F
(Continued)

FOREIGN PATENT DOCUMENTS

EP           0950000 B1    10/1999
EP           2834577 A2     2/2015
(Continued)

OTHER PUBLICATIONS

Zhu et al., A Comprehensive review of thermoelectric technology: Materials, application, modelling and performance improvement; 2016; Elsevier; Renewable and sustainable energyreviews 65 (2016), p. 698-726 (Year: 2016).*

(Continued)

*Primary Examiner* — Emmanuel E Duke
(74) *Attorney, Agent, or Firm* — Reising Ethington P.C.

(57) ABSTRACT

A heating and/or cooling device having one or more thermoelectric threads. The thermoelectric thread includes a plurality of individual thermoelectric elements, each thermoelectric element having a first side and a second side. A set of first side electrodes connects at least some of the thermoelectric elements at the first side, and a set of second side electrodes connects at least some of the thermoelectric elements at the second side. An electrically insulative covering at least partially surrounds the plurality of individual thermoelectric elements. The electrically insulative covering is configured to be woven into or otherwise integrated with a fabric.

19 Claims, 5 Drawing Sheets

(51) Int. Cl.
| | |
|---|---|
| *B60N 2/56* | (2006.01) |
| *D02G 3/04* | (2006.01) |
| *D03D 15/00* | (2021.01) |
| *D02G 3/40* | (2006.01) |
| *D02G 3/44* | (2006.01) |
| *H01L 35/08* | (2006.01) |
| *H01L 35/16* | (2006.01) |
| *H01L 35/18* | (2006.01) |
| *H01L 35/22* | (2006.01) |

(52) U.S. Cl.
CPC ............. *D02G 3/404* (2013.01); *D02G 3/441* (2013.01); *D02G 3/444* (2013.01); *D03D 15/0027* (2013.01); *H01L 35/08* (2013.01); *H01L 35/32* (2013.01); *D10B 2101/20* (2013.01); *D10B 2331/04* (2013.01); *D10B 2401/16* (2013.01); *H01L 35/16* (2013.01); *H01L 35/18* (2013.01); *H01L 35/22* (2013.01)

(58) Field of Classification Search
CPC ...... B60N 2/5685; B60N 2/5692; B60N 2/58; D02G 3/045; D02G 3/404; D02G 3/441; D02G 3/444; D10B 2401/16; D10B 2101/20; D10B 2331/04; D10B 2505/08; D03D 15/0027; D03D 1/0088
See application file for complete search history.

(56) References Cited

U.S. PATENT DOCUMENTS

| | | | |
|---|---|---|---|
| 6,125,636 A | 10/2000 | Taylor et al. | |
| 6,254,179 B1 | 7/2001 | Kortüm et al. | |
| 6,410,893 B1 * | 6/2002 | Yagnik ................... | C08K 3/22 219/528 |
| 6,855,410 B2 | 2/2005 | Buckley | |
| 7,950,735 B2 | 5/2011 | Major et al. | |
| 8,397,518 B1 | 3/2013 | Vistakula | |
| 9,272,647 B2 | 3/2016 | Gawade et al. | |
| 9,644,313 B2 | 5/2017 | Sotzing et al. | |
| 2005/0193742 A1 | 9/2005 | Arnold | |
| 2009/0229785 A1 | 9/2009 | Kadle et al. | |
| 2010/0093238 A1 * | 4/2010 | Schwarz ................... | F41H 3/02 442/116 |
| 2010/0107657 A1 | 5/2010 | Vistakula | |
| 2014/0182644 A1 | 7/2014 | Aguirre et al. | |
| 2015/0107639 A1 | 4/2015 | Brueck et al. | |
| 2018/0171514 A1 | 6/2018 | Cobanoglu et al. | |
| 2018/0240956 A1 | 8/2018 | Yazawa et al. | |
| 2018/0254402 A1 * | 9/2018 | Gruenwald ........... | H01L 35/325 |
| 2018/0361704 A1 | 12/2018 | Jin et al. | |

FOREIGN PATENT DOCUMENTS

| | | |
|---|---|---|
| WO | WO9924275 A1 | 5/1999 |
| WO | WO2013124866 A2 | 8/2013 |
| WO | WO2015002825 A1 | 1/2015 |
| WO | WO2017059392 A1 | 4/2017 |
| WO | WO2017063994 A1 | 4/2017 |
| WO | WO2017096044 A1 | 6/2017 |

OTHER PUBLICATIONS

U.S. Appl. No. 62/489,138, "Heating and Cooling Device", The Regents of the University of Michigan, filed Apr. 24, 2017, 16 pages.
International Search Report corresponding to International application No. PCT/US2019/021154, dated Jun. 18, 2019, 3 pages.
Written Opinion corresponding to International application No. PCT/US2019/021154, dated Jun. 18, 2019, 7 pages.
R. Bansevicius et al., "The Body Cooling System Integrated into the Clothes", Institutional Repository of Kaunas University of Technology, 2007, pp. 3-6.
J. Wang et al., "Adaptive Textiles Technology with Active Cooling & Heating", University of California, San Diego, Jan. 2017, pp. 1-7.
Eric Hu et al., "Development of a Cooling Fabric from Conducting Polymer Coated Fibres: Proof of Concept", Synthetic Metals 150, Mar. 2005, pp. 139-143.
Gunathilake Banda Delkumburewatte et al., "Wearable Cooling System to Manage Heat in Protective Clothing", Journal of the Textile Institute, Aug. 2011, pp. 483-489.
Boris Russ et al., "Organic Thermoelectric Materials for Energy Harvesting and Temperature Control", Nature Reviews Materials, vol. I, Oct. 2016, 16050 EP, 14 pages.

* cited by examiner

THERMOELECTRIC THREAD FOR A HEATING AND/OR COOLING DEVICE

CROSS-REFERENCE TO RELATED APPLICATIONS

This application claims the benefit of U.S. Provisional Application No. 62/639,755 filed Mar. 7, 2018, the entire contents of which is hereby incorporated by reference in its entirety.

TECHNICAL FIELD

The present disclosure relates generally to thread that can be used in various heating and cooling applications.

BACKGROUND

During exercise, the human body produces a lot of heat. Depending on the intensity, and the environment in which it is performed, exercise can elevate the body's core temperature from a nominal 37° C. to in excess of 40° C. Given the drastic consequences of an elevated body core temperature (e.g., decreased performance, exhaustion, stroke, and even death), this body heat should be dissipated rapidly. Dissipation pathways include convection (air-movement), conduction (cool-contact), evaporation (sweat), and radiation (electromagnetic). As the surrounding temperature increases, heat dissipation via these pathways can be challenging. Wearable devices that can assist an athlete's body in thermoregulation during exercise can be beneficial. A complementary problem can also exist for athletes (e.g., mountain climbers, figure skaters, divers, swimmers, etc.) that are in near-rest modes of activity in very cold environments. Existing commercial heating and cooling applications such as seats, clothing, etc. do not adequately address these heating and cooling needs of users, such as athletes to cite one example, as they often require bulky heating or cooling elements to be integrated with the particular temperature-controlled item.

SUMMARY

According to one embodiment, there is provided a thermoelectric thread, comprising: a plurality of individual thermoelectric elements, each thermoelectric element having a first side and a second side; a set of first side electrodes, wherein each first side electrode connects at least some of the thermoelectric elements at the first side of the thermoelectric elements; a set of second side electrodes, wherein each second side electrode connects at least some of the thermoelectric elements at the second side of the thermoelectric elements; and an electrically insulative covering that at least partially surrounds the plurality of individual thermoelectric elements, wherein the electrically insulative covering is configured to be woven into or integrated with a fabric.

In accordance with various embodiments, the thermoelectric thread may have any one or more of the following features, either singly or in any technically feasible combination:

- each thermoelectric element comprises a compacted thermoelectric powder, and the powder may synthesized nanostructures and/or may be selected from the group consisting of silicon-germanium (SiGe), lead telluride (PbTe), bismuth telluride ($Bi_2Te_3$), silver antimony telluride ($AgSbTe_2$), germanium telluride (GeTe), skutterudites ($CoSb_3$), and zinc antimony ($Zn_4Sb_3$).
- each thermoelectric element may comprise a p-type doped thermoelectric element or an n-type doped thermoelectric element.
- the first side electrodes or the second side electrodes may be made from at least one of copper, graphite, titanium, brass, silver, and platinum.
- the set of first side electrodes and the set of second side electrodes may be oriented in a daisy chain configuration to connect the plurality of individual thermoelectric elements.
- at least some of the first side electrodes may connect pairs of adjacent thermoelectric elements and at least some of the second side electrodes may connect pairs of adjacent thermoelectric elements at the second side of the thermoelectric elements.
- the electrically insulative covering may comprise silicone rubber.
- the electrically insulative covering may comprise a thermally conductive polymer, and the polymer may include a polyester fabric coated with poly(3,4-ethylenedioxythiophene) (PEDOT).

In one or more embodiments, the thermoelectric thread may be incorporated into a heating and/or cooling device that also includes a power source operably coupled to at least one first side electrode or second side electrode, and a temperature controller operably coupled to at least one first side electrode or second side electrode. The thermoelectric thread may be woven with a fiber thread into the fabric. When woven, a weave pattern of the thermoelectric thread may be used that situates a majority of the first side electrodes on a first side of the fabric. The fabric may be a woven fabric and the weave pattern may include an inlay of the thermoelectric thread into the woven fabric. Also, the heating and/or cooling device may further comprise a plurality of thermoelectric threads, wherein the plurality of thermoelectric threads are connected in parallel or in a mesh circuit. Further, the temperature controller may be used to provide feedback to the power source to control an amount of supplied current to the thermoelectric thread. Further, the heating and/or cooling device may comprise a portion of a seat for a vehicle.

According to another embodiment, there is provided a thermoelectric thread, comprising: a plurality of individual thermoelectric elements, each individual thermoelectric element being a p-type doped thermoelectric element or an n-type doped thermoelectric element; and an electrically insulative covering that at least partially surrounds the plurality of individual thermoelectric elements, wherein the electrically insulative covering is configured to be woven into or integrated with a fabric, and wherein the individual thermoelectric elements are spaced from each other within the electrically insulative covering and each n-type doped thermoelectric element is connected with an electrode to each p-type doped thermoelectric element. In at least some embodiments, each n-type doped thermoelectric element alternates with a p-type doped thermoelectric element along a length of the thermoelectric thread.

BRIEF DESCRIPTION OF THE DRAWINGS

Preferred exemplary embodiments will hereinafter be described in conjunction with the appended drawings, wherein like designations denote like elements, and wherein.

DESCRIPTION OF THE ILLUSTRATED EMBODIMENTS

To overcome at least some of the above-described disadvantages, it would be desirable to provide a more streamlined integration of thermoelectric elements in clothing and other human heating and cooling applications. Further, with the development of a thermoelectric thread containing thermoelectric elements, as described herein, it may be possible to create a more aesthetically pleasing temperature-controlled item without sacrificing efficacy or increasing manufacturing costs. Accordingly, described below are embodiments of a thermoelectric thread for a heating and/or cooling device that can be used in various applications. The thread includes a plurality of individual thermoelectric elements that are segmented or spaced from one another along the length of the thread. The thermoelectric elements are connected with electrodes such that with an applied current, a first side of each thermoelectric element becomes a cooling side and a second side of each thermoelectric element becomes a warming side. An electrically insulative covering at least partially covers the thermoelectric elements and the electrodes. The thermoelectric thread has a form factor which allows it to be woven into fabric, and accordingly, it can be easily used in specialized commercial heating and cooling applications such as seats, clothing, etc. This form factor can result in clothing, for example, that does not overly restrict the wearer's mobility or range of motion. Further, the form factor can result in athletic wear, more particularly, that does not alter the form, function, flexibility, weight, size, robustness, or portability of standard athletic wear.

Figure 1:
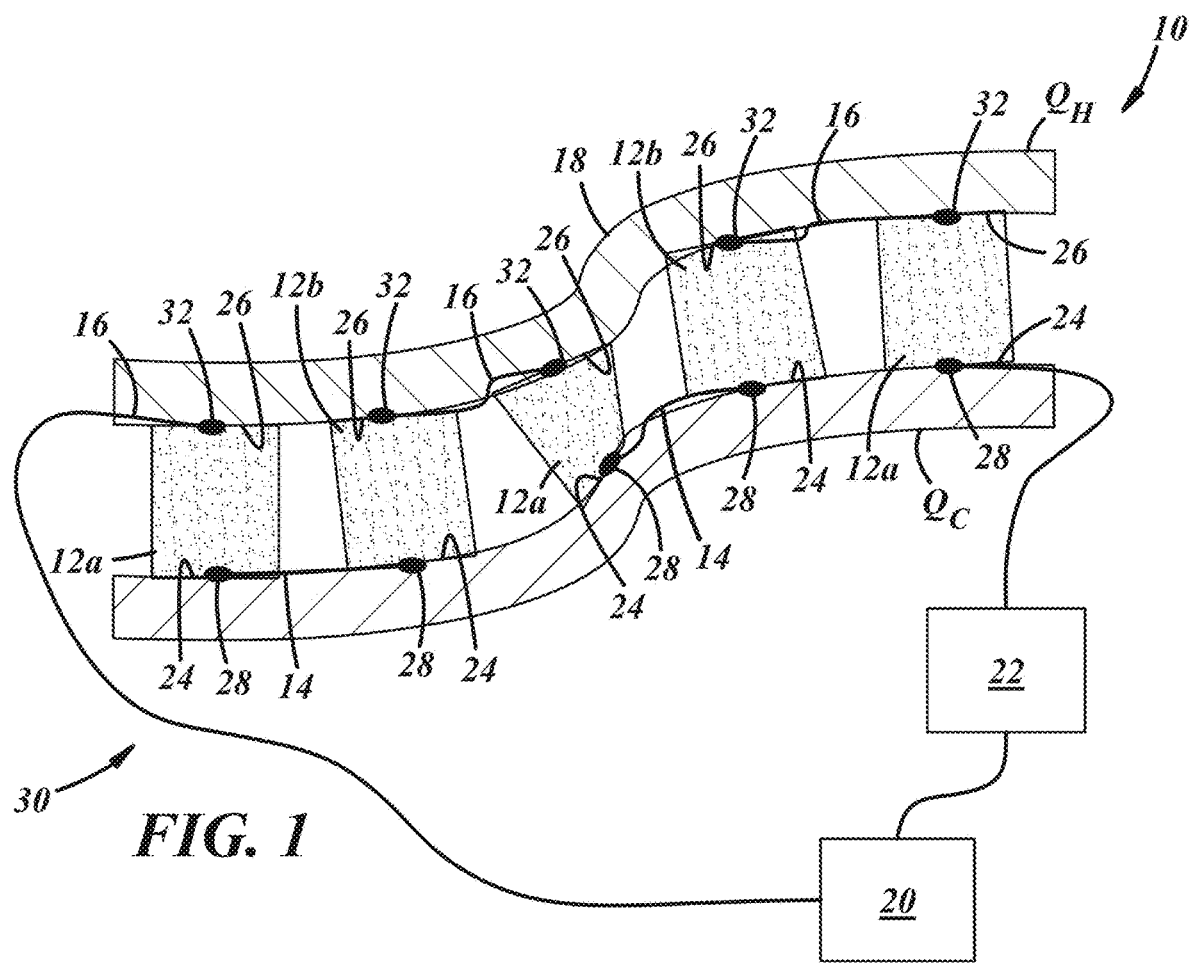
FIG. 1 is a schematic representation of a heating and/or cooling device including a thermoelectric thread.

FIG. 1 is a schematic, cross-section view of a thermoelectric thread 10 in accordance with one embodiment. The thermoelectric thread 10 has a thread-like form factor and is configured to be woven into a fabric. The thermoelectric thread 10 includes a plurality of individual thermoelectric elements 12, a set of first side electrodes 14, a set of second side electrodes 16, and an electrically insulative covering 18. In this embodiment, the thermoelectric elements 12 are connected in series via the first side electrodes 14 and the second side electrodes 16, although other wiring schemes are certainly possible. The thermoelectric elements 12 are operably coupled to a power source 20 and a temperature controller 22, which are schematically illustrated as separate components, but may be integrated together in a common device, housing or the like. Components of the thermoelectric thread 10, as well as any components associated with the thermoelectric thread, that are "connected" or "coupled" may be directly on, engaged, connected, or coupled to the other specified component, or intervening elements or layers may be present. The thermoelectric thread 10 with the power source 20 and the temperature controller 22 together comprise a heating and/or cooling device 30.

In some embodiments, the heating and/or cooling device 30 is strategically placed on a portion of the human body where blood vessels are closest to the skin, such as the back of the torso, back of the neck, extremities, etc. The heating and/or cooling device 30 can absorb heat from the skin, and dissipate it to the external environment, thereby reducing body temperature. Blood circulation will continuously carry heat produced elsewhere in the body to this cooled skin area to effect a heat transfer stream from the body to the external environment. The reverse is true for heating the body.

The thermoelectric elements 12 each have a first side 24 and a second side 26. In the illustrated embodiment, the first side 24 is a cooling side $Q_C$ and the second side 26 is a warming side $Q_H$. In this embodiment, each first side 24 is coupled at a first side junction 28 to one of the first side electrodes 14. Similarly, each second side 26 is coupled at a second side junction 32 to one of the second side electrodes 16. In one embodiment, the thermoelectric elements 12 comprise a compacted thermoelectric powder, which may be selected from the group consisting of silicon-germanium (SiGe), lead telluride (PbTe), bismuth telluride ($Bi_2Te_3$), silver antimony telluride ($AgSbTe_2$), germanium telluride (GeTe), skutterudites ($CoSb_3$), and zinc antimony ($Zn_4Sb_3$). The thermoelectric powder may be baked, deposited, or printed. In another embodiment, the thermoelectric powder can be synthesized nanostructures. In the illustrated embodiment, each thermoelectric element 12 is a semiconductor. More particularly, thermoelectric elements 12 include alternating p-type doped thermoelectric elements 12a and n-type doped thermoelectric elements 12b. The plurality of thermoelectric elements 12 are connected in series with a daisy chain wiring scheme within the thermoelectric thread 10, and more particularly, within the electrically insulative covering 18. Whether the first side 24 or the second side 26 of the thermoelectric thread 10 is a warming side or a cooling side can depend on the direction of applied current, in view of the daisy chain wiring scheme of the thermoelectric elements 12 within the thermoelectric thread 10, although other wiring schemes may be possible. In the illustrated example, a change in polarity of an applied DC voltage via the power source 20 can switch $Q_C$ and $Q_H$ and accordingly will switch the cooling and warming sides, respectively.

The thermoelectric elements 12 have a small size, about 10×10×10 micron cubes in one embodiment, although other shapes are certainly possible. Such a small size allows the overall size of the thermoelectric thread 10 to be small. In one embodiment, the diameter of the thread is about 0.80 mm. The spacing between the thermoelectric elements may be adapted based on the needs of the heating and/or cooling device 30. For example, the inclusion of more thermoelectric elements 12 that are more tightly spaced along the length of the thread 10 may result in better or more efficient performance, but may impact the pliability or flexibility of the thread. Adaptations can be made depending on the desired implementation.

Figure 2:
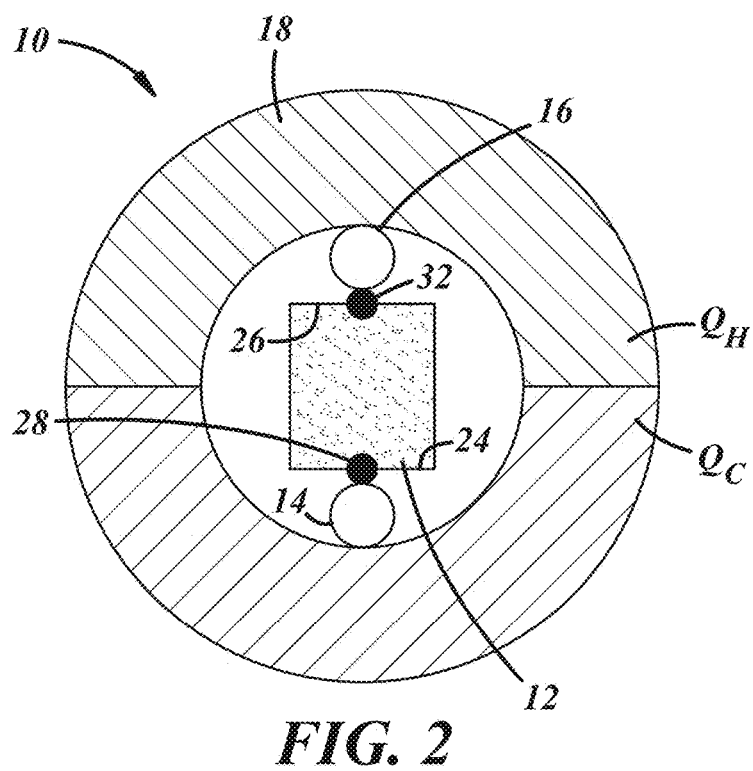
FIG. 2 is a cross-sectional view of the thermoelectric thread of FIG. 1.

FIG. 2 is a schematic illustration showing a cross-section of the thermoelectric thread 10 at one of the thermoelectric elements 12. The first side electrode 14 is coupled to the first side 24 of the thermoelectric element 12 at the junction 28 with solder. Similarly, the second side electrode 16 is coupled to the second side 26 of the thermoelectric element 12 at the junction 32 with solder. The electrodes 14, 16 may be made from one or more operable materials, such as copper, aluminum, graphite, titanium, brass, silver, or platinum, to cite a few examples. Similarly, one or more operable materials may be used at the junctions 28, 32, such as solder alloys of tin-lead, tin-zinc, lead-silver, zinc-aluminum, tin-silver, or tin-bismuth, to cite a few examples. In a preferred embodiment, copper fine metal wires are used for the first side electrodes 14 and the second side electrodes 16. Copper may be advantageous in some embodiments as it is a non-hazardous material having optimal electrical conductivity and resistance properties.

The thermoelectric elements 12, the first side electrodes 14, and the second side electrodes 16 are encapsulated within an electrically insulative covering 18. The electrically insulative covering 18 forms the main thread body which is configured to be woven or integrated with a fabric. The electrically insulative covering 18 is thermally conductive, and can be made from a number of operable materials. In one embodiment, silicone rubber is used, as it has good chemical stability and flame retardancy. Further, silicone rubber can be immersed in water for a long period with a water absorption of about 1% without impacting the mechanical strength. Additionally, under ordinary pressure, contact with steam causes almost no deterioration of silicone rubber. Accordingly, silicone rubber may be desirable in washable implementations of the heating and/or cooling device. Silicone rubber also has good resistance to oil at high temperatures, as well as resistance to solvents and other chemicals. With respect to its insulative performance, silicone rubber has a high insulation resistance of about 1 T ohm-m to 1000 T ohm-m, and its insulative properties are stable over a wide range of temperatures and across a wide frequency spectrum. With respect to its thermal conduction performance, the thermal conductivity of silicone rubber is about 0.2 W/(m·K), although fillers, which are detailed further below, can be used to improve the thermal conductivity to about 1.3 W/(m·K).

In another embodiment, the electrically insulative covering 18 is made from a thermally conductive polymer. Coated polyester may be used in this embodiment, or another off-the shelf fabric coated with a conducting polymer. In one embodiment, the coating is poly(3,4-ethylenedioxythiophene) or PEDOT which can be applied via a vapor deposition process or the like on the electrically insulative covering 18. One or more fillers may be used in the electrically insulative covering material, whether it is a coated polyester, silicone rubber, or some other material. For example, single walled carbon nanotubes (SWCNTs) can be used as a conductive filler material, or glass fibers may also be used. Other organic or inorganic fillers can be used, the amounts of which can be adjusted depending on the desired thermal conductivity.

Figure 3:
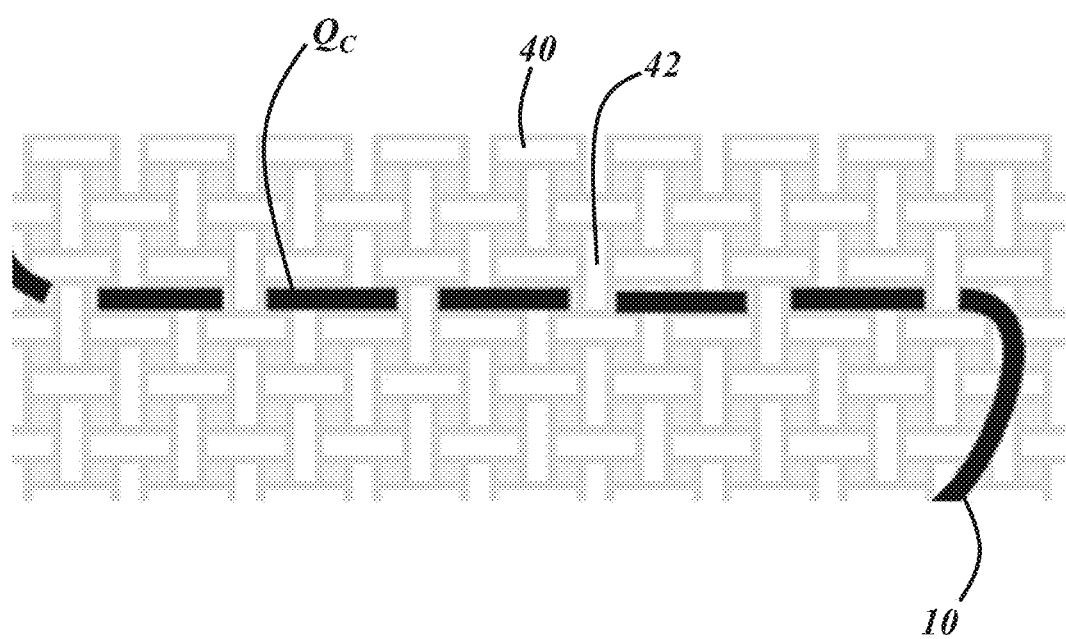
FIG. 3 illustrates one example of a woven thermoelectric thread.

FIG. 3 shows one example of a thermoelectric thread 10 woven into a fabric 40, such as the thermoelectric thread 10 that is part of the heating and/or cooling device 30 of FIG. 1. In a preferred embodiment, when the thread 10 is woven into a fabric 40, is to use a weave pattern which minimizes looping and crossing of one or more thermoelectric threads. Such an embodiment can help increase thermal efficiency. In the illustrated embodiment, the cooling side $Q_C$ of the thermoelectric thread 10 is exposed on a first side 42 of the fabric 40 (which is changeable such that the heating side $Q_H$ is exposed is exposed on the first side 42 of the fabric 40, depending on the direction of applied current, in this embodiment). Given this weave pattern, a majority of the first side electrodes 14 are situated towards the first side 42 of the fabric 40. Accordingly, a majority of the second side electrodes 16 are situated away from the first side 42 of the fabric 40. Other weave patterns, besides an inlay into a woven fabric 40 as illustrated in FIG. 3, can facilitate such arrangements of thermoelectric threads and help promote thermal efficiency, as well. For example, plating with special feeders can help impart a desired orientation of one or more thermoelectric threads 10. CNC knitting machines may be used to weave one or more thermoelectric threads 10 into fabrics at the time of manufacturing. In other embodiments, the thermoelectric thread 10 could be embedded into a product in a non-woven implementation, such as in a foam layer in seating or another operable application.

Figure 4:
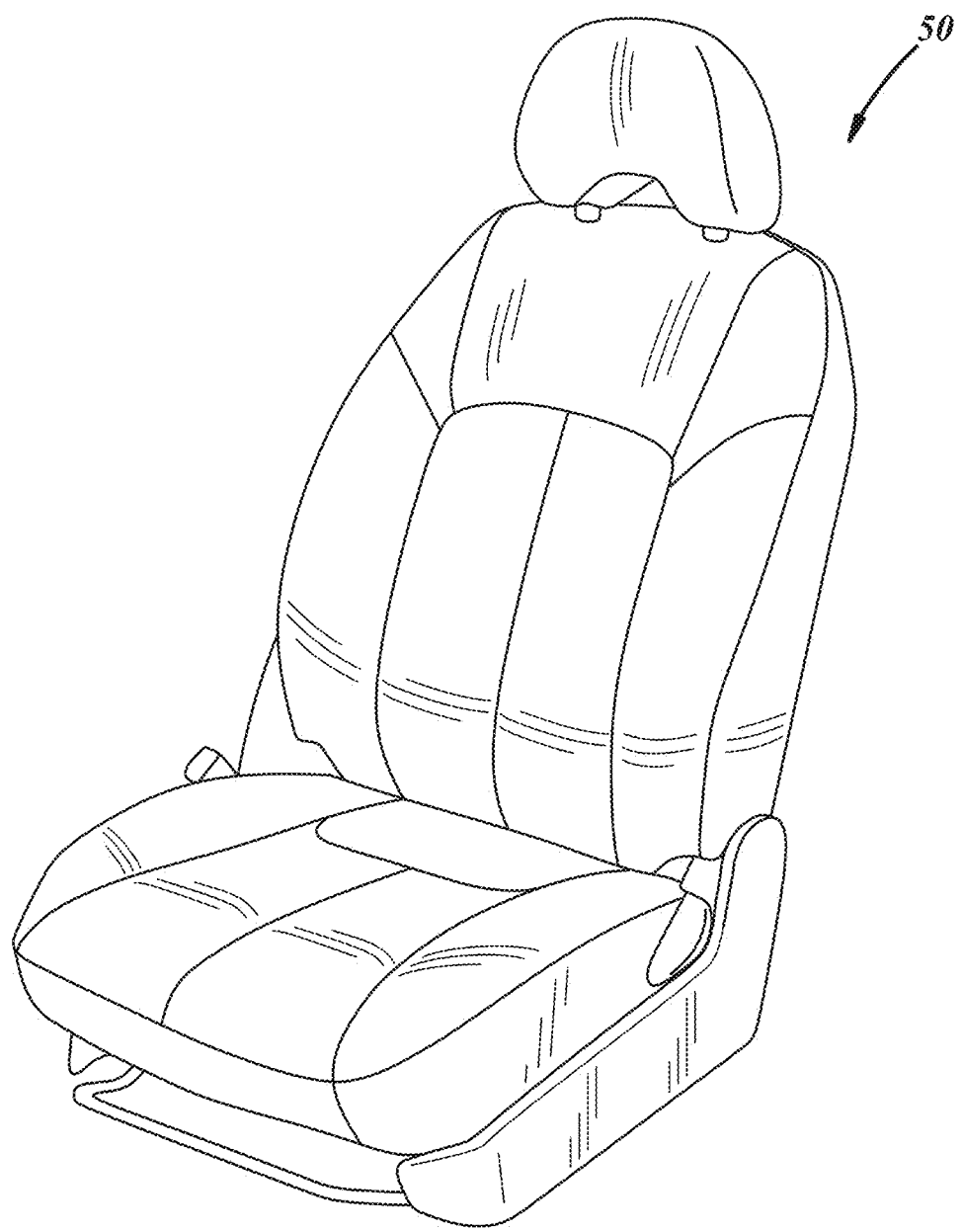
FIG. 4 illustrates a vehicle seat including an integrated heating and/or cooling device with a thermoelectric thread.
Figure 5:
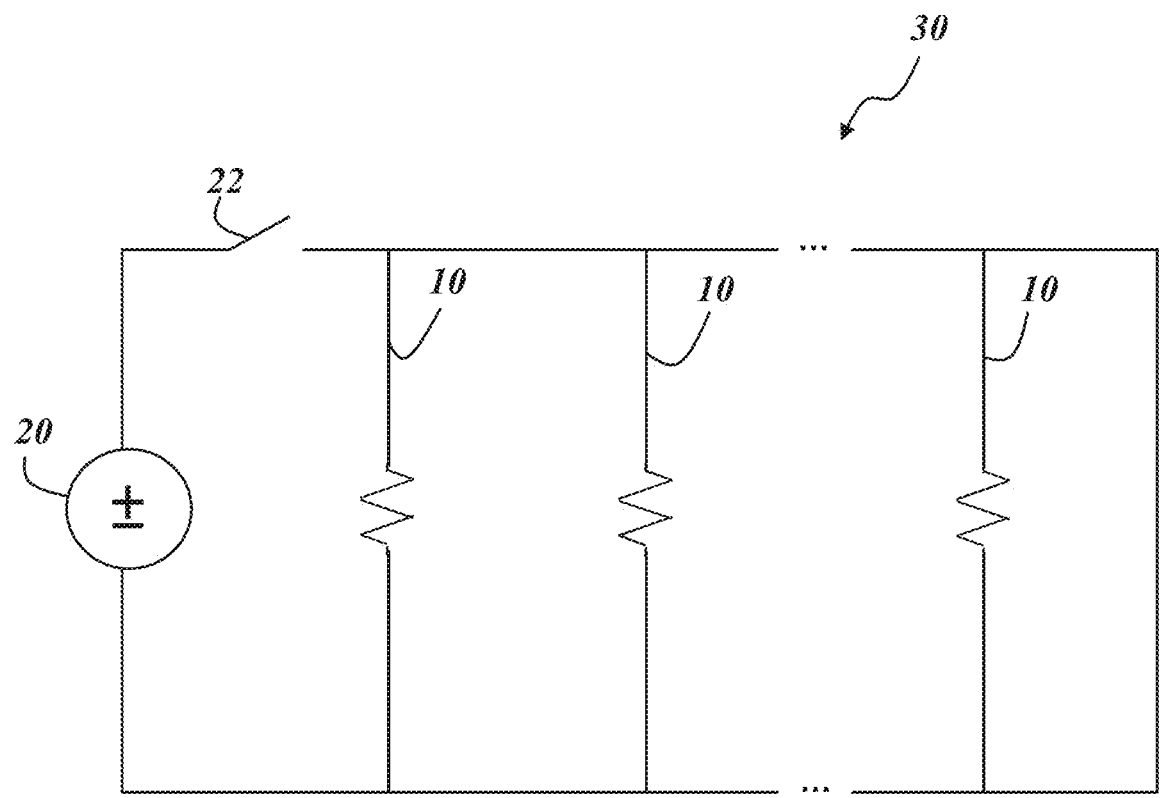
FIG. 5 is a circuit schematic of one embodiment of a heating and/or cooling device.

FIG. 4 shows a seat 50 for a vehicle which may include an integrated heating and/or cooling device, such as the heating and/or cooling device 30 depicted in FIG. 1, or another heating and/or cooling device having a plurality of thermoelectric threads 10. The power source 20 or the controller 22 of the heating and/or cooling device 30, when implemented in a vehicle, may be integrated with other vehicle systems and modules, such as the car battery for the power source and a body control module or another vehicle system module for controlling the temperature. In a preferred embodiment, a plurality of thermoelectric threads 10 are used, and may be connected as schematically represented in FIG. 5. Using a mesh circuit or connecting multiple thermoelectric threads 10 in parallel may provide built-in robustness for the heating and/or cooling device 30. In a wearable implementation of the heating and/or cooling device 30, the power source 20 could be a rechargeable, single-cell, button-sized battery (e.g., smaller than 25 mm in diameter and 6 mm in thickness). Other connection schemes, power sources, controllers, etc. are certainly possible, and may be adapted for other implementations besides vehicle seats, such as clothing, food carrying bags, medical devices, or stadium seating, to cite just a few examples.

Figure 6:
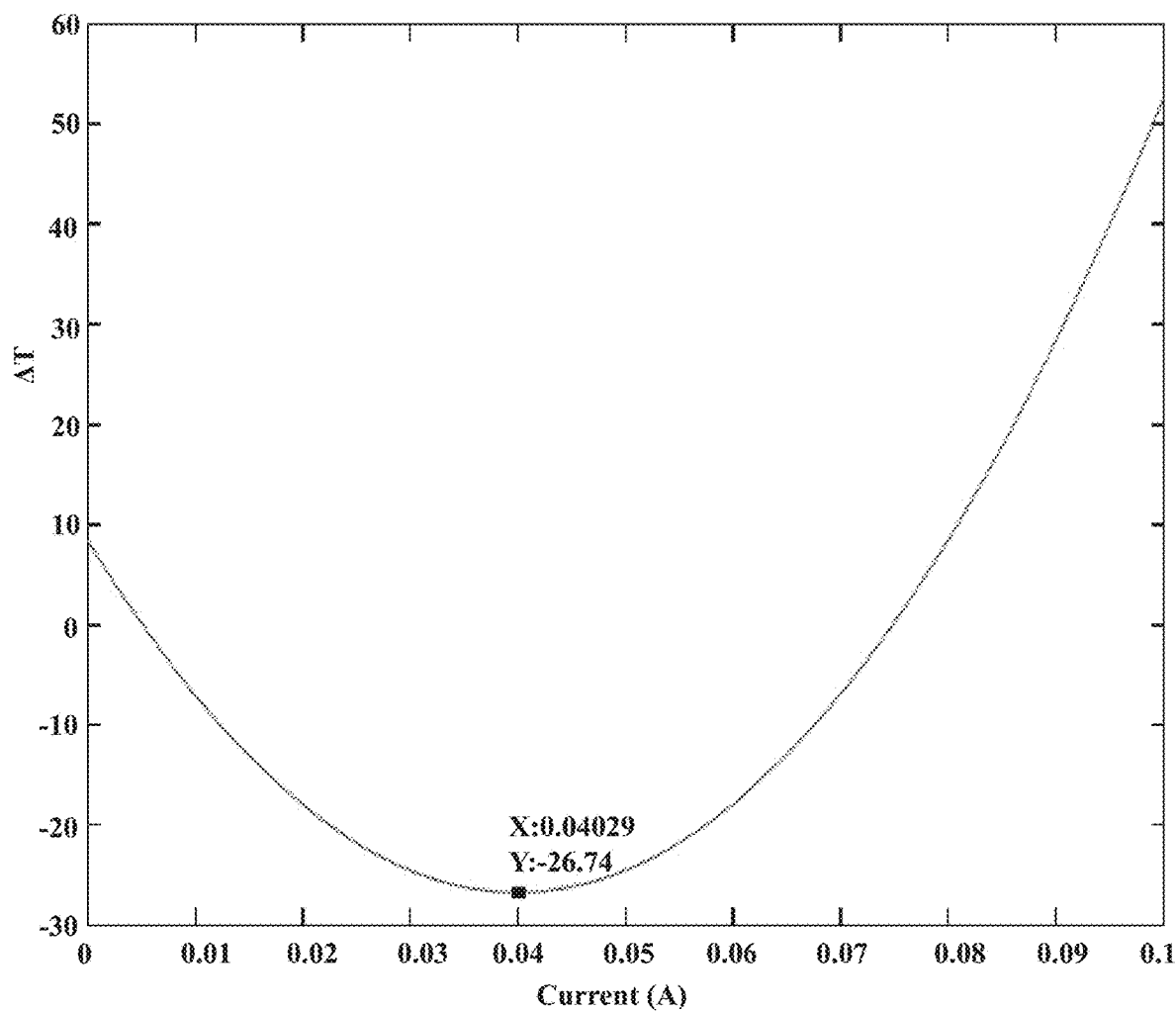
FIG. 6 is a graph showing a simulated change in temperature for a given current applied to a thermoelectric thread in accordance with one embodiment.

Control of the heating and/or cooling device 30 may be implemented in a variety of ways. In one example, open loop heating/cooling is carried out by driving a supply current through one or more thermoelectric threads 10 without any temperature-based feedback control. This may be done using either a current or voltage source. In another example, a closed loop method is used, in which a temperature sensor is used to provide feedback to the device 30 to control the amount of supplied current. It is also possible to have pulse width modulated (PWM) control. In embodiments such as the vehicle seat of FIG. 4, it is desirable to provide one or more thermoelectric threads 10 that can remove about 20-30 J/sec for cooling ($Q_C$) and that can provide about 60-70 J/sec for heating ($Q_H$). This may be accomplished, in one example, through the use of about 100,000 bismuth-telluride thermoelectric elements 12 in one or more thermoelectric threads 10. FIG. 6 is a graph illustrating the possible $\Delta T$ for a given current, using copper electrodes 14, 16 and bismuth telluride thermoelectric elements 12, as described above. More particularly, the $\Delta T$ is the temperature difference between the hot side ($Q_H$) and the cold side ($Q_C$) plotted against the input current to the device for a single thermal load (J/sec) on the thermoelectric thread 10. Such an embodiment was able to reach about 27 J/sec cooling with about 0.04 amps of applied current. In a wearable implementation of the heating and/or cooling device 30, it is desirable to provide one or more thermoelectric threads 10 that can remove about 5 J/sec for cooling ($Q_C$) and that can provide about 10 J/sec for heating ($Q_H$). System effects such as losses due to power distribution, clothing material, apparel layering, sweat, and humidity may be considered when assessing the desired heating and cooling efficiency.

It is to be understood that the foregoing description is of one or more preferred exemplary embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "for example," "e.g.," "for instance," and "such as," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation. In addition, the term "and/or" is to be construed as an inclusive OR. Therefore, for example, the phrase "A, B, and/or C" is to be interpreted as covering all the following: "A"; "B"; "C"; "A and B"; "A and C"; "B and C"; and "A, B, and C."

The invention claimed is:

1. A thermoelectric thread, comprising: a plurality of individual thermoelectric elements, each thermoelectric element having a first side and a second side, wherein each thermoelectric element comprises a compacted thermoelectric powder; a set of first side electrodes, wherein each first side electrode connects at least some of the thermoelectric elements at the first side of the thermoelectric elements at a first side junction; a set of second side electrodes, wherein each second side electrode connects at least some of the thermoelectric elements at the second side of the thermoelectric elements at a second side junction, wherein a first material is used at the first side junction or the second side junction, a second material is used for the set of first side electrodes or the set of second side electrodes, and a third material is used for each individual thermoelectric element, and wherein the first material, the second material, and the third material are all different materials; and an electrically insulative covering that at least partially surrounds the plurality of individual thermoelectric elements, wherein the electrically insulative covering is configured to be woven into or integrated with a fabric.

2. The thermoelectric thread of claim 1, wherein the compacted thermoelectric powder is selected from the group consisting of silicon-germanium (SiGe), lead telluride (PbTe), bismuth telluride ($Bi_2Te_3$), silver antimony telluride ($AgSbTe_2$), germanium telluride (GeTe), skutterudites ($CoSb_3$), and zinc antimony ($Zn_4Sb_3$).

3. The thermoelectric thread of claim 1, wherein the compacted thermoelectric powder comprises synthesized nanostructures.

4. The thermoelectric thread of claim 1, wherein each thermoelectric element comprises a p-type doped thermoelectric element or an n-type doped thermoelectric element.

5. The thermoelectric thread of claim 1, wherein the first side electrodes or the second side electrodes are made from at least one of copper, graphite, titanium, brass, silver, and platinum.

6. The thermoelectric thread of claim 1, wherein the set of first side electrodes and the set of second side electrodes are oriented in a daisy chain configuration to connect the plurality of individual thermoelectric elements.

7. The thermoelectric thread of claim 1, wherein at least some of the first side electrodes connect pairs of adjacent thermoelectric elements and at least some of the second side electrodes connect pairs of adjacent thermoelectric elements at the second side of the thermoelectric elements.

8. The thermoelectric thread of claim 1, wherein the electrically insulative covering comprises silicone rubber.

9. The thermoelectric thread of claim 1, wherein the electrically insulative covering comprises a thermally conductive polymer.

10. The thermoelectric thread of claim 9, wherein the thermally conductive polymer includes a polyester fabric coated with poly(3,4-ethylenedioxythiophene) (PEDOT).

11. A heating and/or cooling device, comprising:
the thermoelectric thread of claim 1;
a power source operably coupled to at least one first side electrode or second side electrode; and
a temperature controller operably coupled to at least one first side electrode or second side electrode.

12. The heating and/or cooling device of claim 11, wherein the thermoelectric thread is woven with a fiber thread into the fabric.

13. The heating and/or cooling device of claim 12, wherein a weave pattern of the thermoelectric thread situates a majority of the first side electrodes on a first side of the fabric.

14. The heating and/or cooling device of claim 13, wherein the fabric is a woven fabric and the weave pattern includes an inlay of the thermoelectric thread into the woven fabric.

15. The heating and/or cooling device of claim 11, comprising a plurality of thermoelectric threads, wherein the plurality of thermoelectric threads are connected in parallel or in a mesh circuit.

16. The heating and/or cooling device of claim 11, wherein the temperature controller is used to provide feedback to the power source to control an amount of supplied current to the thermoelectric thread.

17. A seat for a vehicle comprising the heating and/or cooling device of claim 11.

18. A thermoelectric thread, comprising:
a plurality of individual thermoelectric elements, each individual thermoelectric element being a p-type doped thermoelectric element or an n-type doped thermoelectric element; and
an electrically insulative covering that at least partially surrounds the plurality of individual thermoelectric elements, wherein the electrically insulative covering is configured to be woven into or integrated with a fabric, and wherein the individual thermoelectric elements are spaced from each other within the electrically insulative covering and each n-type doped thermoelectric element is connected via a junction with an electrode to each p-type doped thermoelectric element, wherein a first material is used at the junction, a second material is used for the electrode, and a third material is used for each individual thermoelectric element, and wherein the first material, the second material, and the third material are all different materials.

19. The thermoelectric thread of claim 18, wherein each n-type doped thermoelectric element alternates with a p-type doped thermoelectric element along a length of the thermoelectric thread.

* * * * *